US012787154B2

(12) United States Patent
Farkas et al.

(10) Patent No.: US 12,787,154 B2
(45) Date of Patent: Nov. 3, 2026

(54) CONDUCTIVE LEAK BARRIERS TO PROTECT SENSITIVE CIRCUITRY

(71) Applicant: DELL PRODUCTS L.P., Round Rock, TX (US)

(72) Inventors: Sandor Farkas, Round Rock, TX (US); Michael Stumpf, Cedar Park, TX (US); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 198 days.

(21) Appl. No.: 18/901,809

(22) Filed: Sep. 30, 2024

(65) Prior Publication Data

US 2026/0096012 A1 Apr. 2, 2026

(51) Int. Cl.
*H05K 1/02* (2006.01)

(52) U.S. Cl.
CPC ......... *H05K 1/0215* (2013.01); *H05K 1/0272* (2013.01); *H05K 2201/064* (2013.01); *H05K 2201/093* (2013.01)

(58) Field of Classification Search
CPC ............... H05K 1/0215; H05K 1/0272; H05K 2201/064; H05K 2201/093
See application file for complete search history.

(56) References Cited

U.S. PATENT DOCUMENTS 10,684,662 B2 6/2020 Moore et al.
12,596,047 B2 * 4/2026 Park ...................... B60T 17/225
2016/0178475 A1 * 6/2016 Krishnan ........... H05K 7/20836 324/713
2019/0369153 A1 12/2019 Olson et al.
2023/0056076 A1 * 2/2023 Becker .................... G01M 3/16
2024/0369732 A1 * 11/2024 Lee ...................... H05K 7/1427

* cited by examiner

*Primary Examiner* — Timothy J Thompson
*Assistant Examiner* — Amol H Patel
(74) *Attorney, Agent, or Firm* — Larson Newman, LLP

(57) ABSTRACT

A printed circuit board (PCB) includes a first circuit, a second circuit, and a circuit trace disposed between the first circuit and the second circuit. The first circuit has a first contact on a surface of the PCB. The first contact is at a first voltage. The second circuit has a second contact on the surface of the PCB. The second contact is at a second voltage that is lower than the first voltage. The circuit trace is on the surface of the PCB and is coupled to a ground plane of the PCB. The circuit trace is configured to provide a ground path to ground the first contact in the presence of coolant liquid between the first contact and the circuit trace.

20 Claims, 5 Drawing Sheets

100

CONDUCTIVE LEAK BARRIERS TO PROTECT SENSITIVE CIRCUITRY

FIELD OF THE DISCLOSURE

This disclosure relates to information handling systems, and more particularly relates to a printed circuit board including conductive leak barriers to protect sensitive circuitry.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board (PCB) may include a circuit trace disposed between first and second circuits. The first circuit may have a first contact on a surface of the PCB. The first contact may be at a first voltage. The second circuit may have a second contact on the surface of the PCB. The second contact may be at a second voltage that is lower than the first voltage. The circuit trace may be on the surface of the PCB and may be coupled to a ground plane of the PCB. The circuit trace may be configured to provide a ground path to ground the first contact in the presence of coolant liquid between the first contact and the circuit trace.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1A:
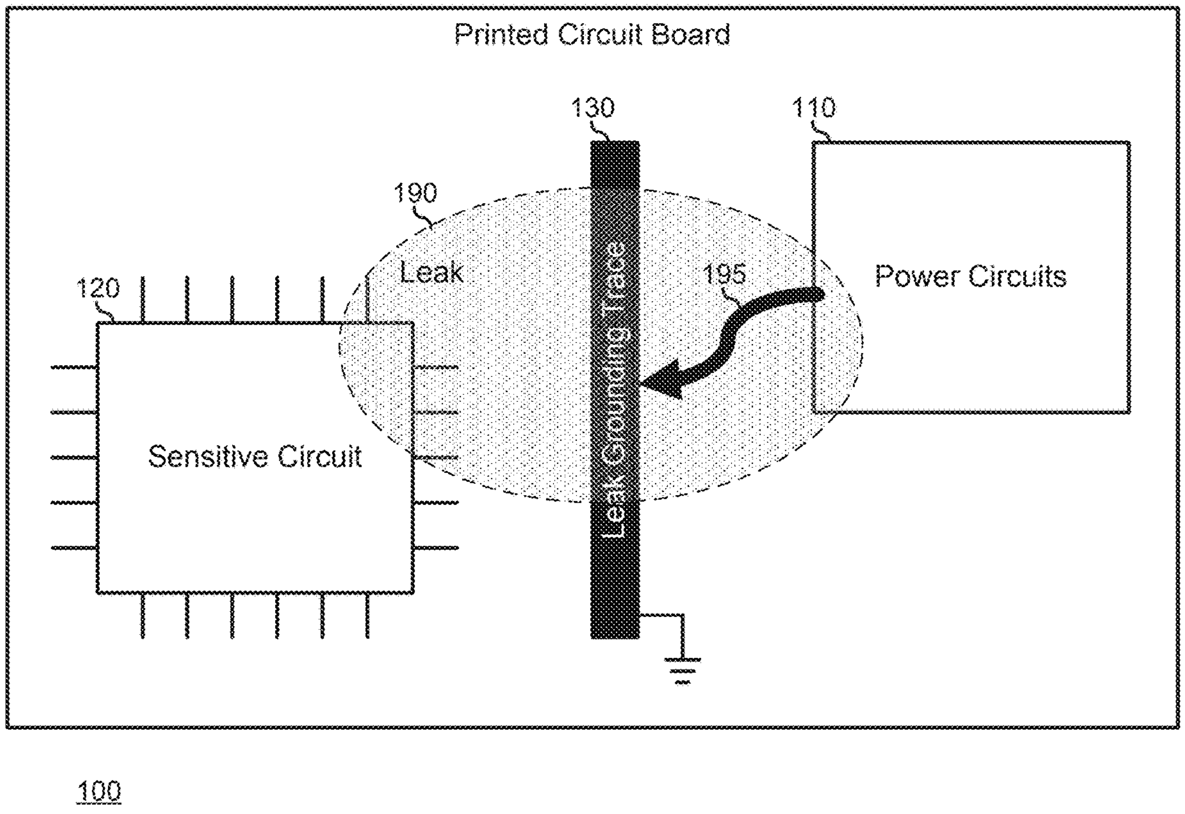
FIGS. 1A and 1B illustrate a printed circuit board (PCB) system according to an embodiment of the present disclosure.
Figure 1B:
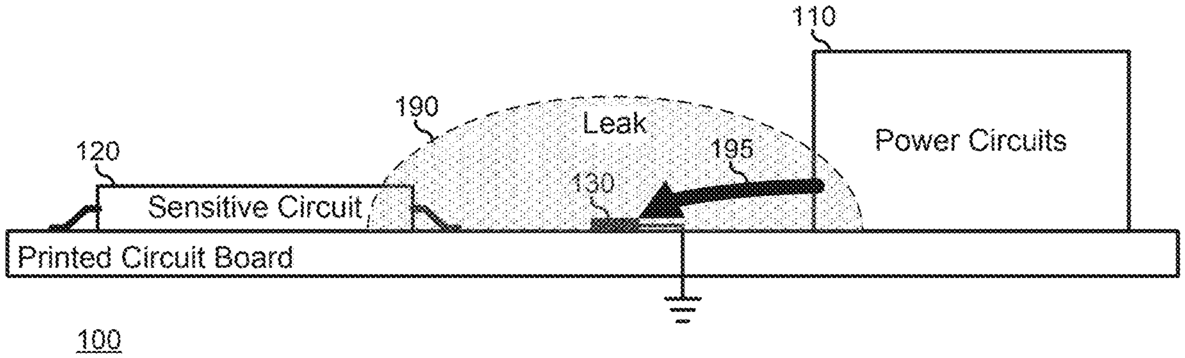

FIGS. 1A and 1B illustrate a printed circuit board (PCB) 100. PCB 100 is characterized by the fact that one or more components of the PCB are cooled by a direct liquid cooling (DLC) system (not illustrated). For example, one or more central processing unit (CPU), memory device, graphics processing unit (GPU), or other component, may generate large amounts of heat that are suitably removed from an enclosure that includes PCB 100 utilizing a DLC system. The heat-generating component may be thermally connected to a cold plate, and the DLC system operates to circulate chilled coolant liquid to the cold plate. In the cold plate, the heat from the component is transferred to the coolant liquid and removed from the component.

DLC systems are increasingly being utilized in computing environments, such as data centers, high-performance computers such as workstations or gaming systems, or the like. However, the introduction of additional components of the DLC system, such as cold plates, tubing to connect the cold plates to chiller components, valves to direct the flow of the coolant liquid, or the like, comes with an increased risk that the DLC system may develop a leak. In particular, connections between the components of the DLC system may be more susceptible to develop a leak. Leaks in a DLC system a pernicious to electrical components because the coolant liquid is typically a water-based liquid, or another conductive liquid. As such, coolant liquid leaked on a PCB may induce shorting between the circuits of on the PCB. Such shorting may lead to data corruption, destruction of sensitive components on the PCB, burning of circuit components and circuit traces, and may even result in a fire or other unsafe condition. Of particular concern is shorting of power circuits to ground, or to other sensitive components.

PCB 100 includes power circuits 110, sensitive circuits 120, and a leak grounding trace 130. Power circuits 110 represent circuits on PCB 100 that provide power for the other components on the PCB. In particular, power circuits 110 may include circuit contacts that are exposed on the surface of PCB 100 and that provide typically higher direct current (DC) voltages and hence are typically sized to source large amounts of current to the PCB. Sensitive circuits 120 represent circuits on PCB 100 that typically provide the processing functions of the PCB. In general, sensitive circuits 120 may be particularly susceptible to data loss or damage in the presence of a coolant liquid leak that shorts electrical contacts of the sensitive circuits to one or more voltage rail of power circuits 110.

PCB 100 is illustrated as experiencing a coolant liquid leak 190 that extends from power circuits 110 to sensitive circuits 120. Leak grounding trace 130 represents a circuit trace on the surface of PCB 100 that is connected to a ground plane of PCB 100. For example, leak grounding trace 130 may represent a circuit trace patterned on the surface of PCB 100 that is connected by a plated through-hole via (not illustrated) to a ground plane of the PCB. Here, leak grounding trace 130 provides a low-resistance circuit path for a current 195 between power circuits 110 and the leak grounding trace. Thus the presence of leak grounding trace 130 operates to protect sensitive circuits 120 from the bulk of the current from power circuits 110. Leak grounding trace 130 may be fabricated on the surface of PCB 100 by any suitable method for forming circuit traces on PCBs, as needed or desired. However leak grounding trace 130 may need to be masked from being covered up in any subsequent process steps, such as steps that provide for the application of a solder mask material or other passivation material layer, silk screen printing material, or the like. In this way, leak grounding trace remains exposed in the final instantiation of PCB 100 in order to provide a ground path for currents from power circuits 110 and sensitive circuits 120 in the presence of a coolant liquid leak.

The capacity of leak grounding trace 130 to sink current from power circuits 110 may be improved by placing the leak grounding trace closer to the power circuits than to sensitive circuits 120, as needed or desired. The capacity of leak grounding trace 130 to sink current from power circuits 110 may be further improved by increasing the surface area of the leak detection trace, for example by widening the leak detection trace. In general, leak grounding trace 130 may be fabricated on PCB 100 in regions of the PCB that are susceptible to experiencing coolant liquid leaks, such as near the connections between the components of the DLC system. In a particular case, leak grounding trace 130 is provided in an uninterrupted ring around power circuits 110 to protect sensitive circuits 120 that are located in any orientation on PCB 100 with respect to the power circuits. The dimensions of the elements on PCB 100, and particularly of leak 190, may be exaggerated for clarity of illustration. Further the thickness of leak grounding trace 130, as shown in FIG. 1B, may be understood to be exaggerated and it will be understood that the thickness of a typical circuit trace formed on the surface of a PCB will be relatively small. For example, the typical trace thickness for a 1-ounce copper surface plating may be around 1.38 mils (~35 μm). As such, leak grounding trace 130 may not be expected to provide significant damming or flow control of a coolant liquid leak.

Figure 2A:
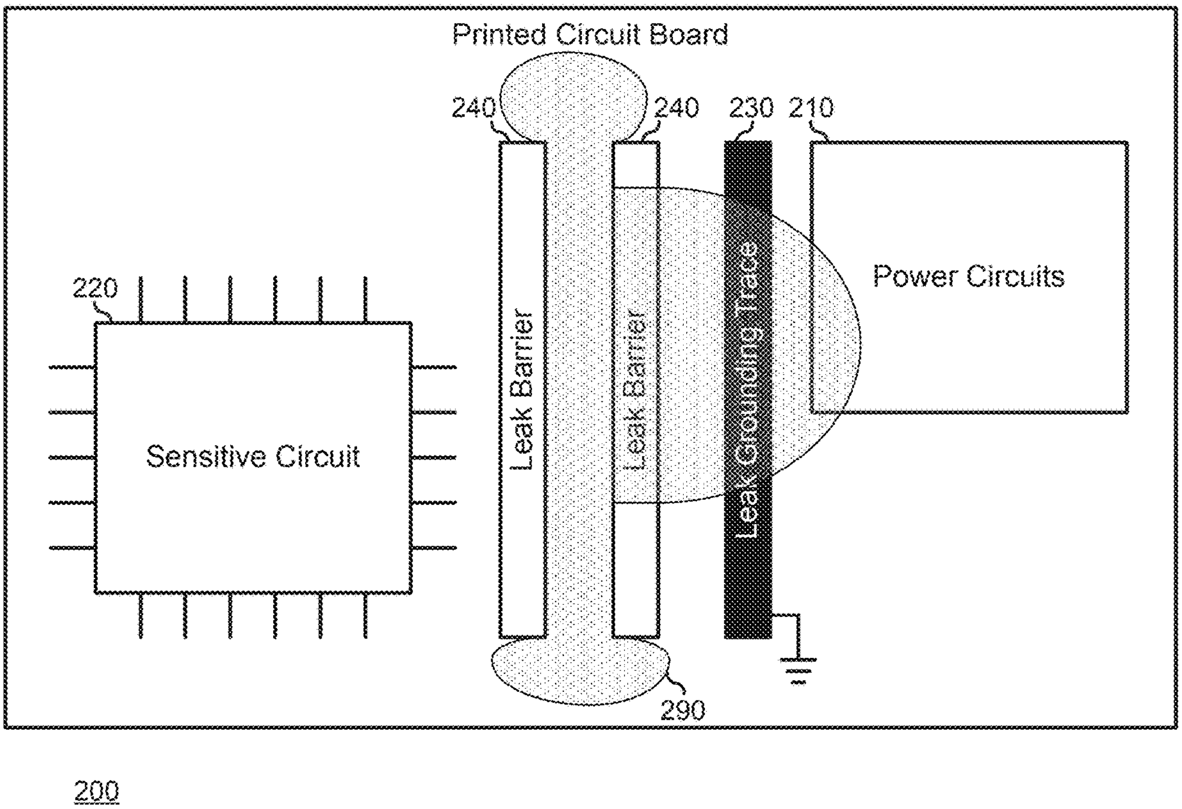
FIGS. 2A and 2B illustrate a PCB according to another embodiment of the present disclosure.
Figure 2B:
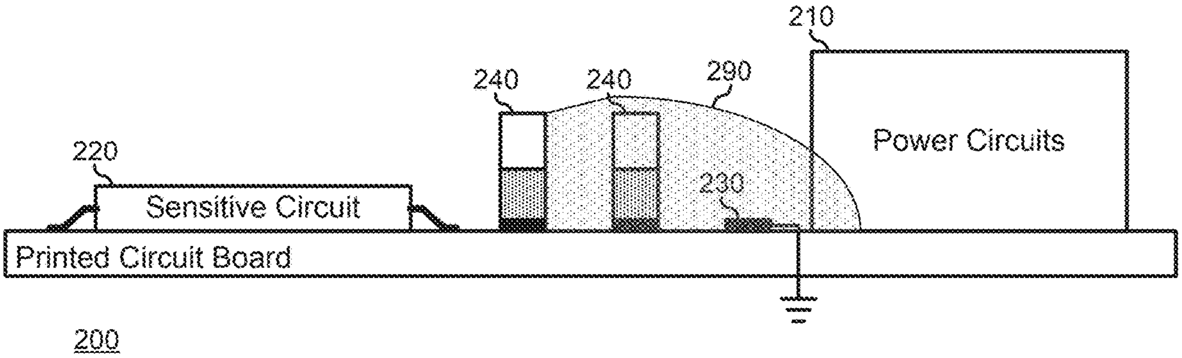

FIGS. 2A and 2B illustrate a PCB 200 similar to PCB 100. As such, PCB 200 includes power circuits 210 similar to power circuits 110, sensitive circuits 220 similar to sensitive circuits 120, and a leak grounding trace 230 similar to leak grounding trace 130. PCB 200 is illustrated as experiencing a coolant liquid leak 290. PCB 200 further includes leak barriers 240. Leak barriers 240 represent features fabricated on the surface of PCB 200 that are configured to present a raised profile over the other features provided on the surface of the PCB. For example, leak barriers 240 are shown as including a circuit trace layer on the surface of PCB 200, a solder mask layer (indicated by the darkened region) formed atop the circuit trace, and a silk screen printed layer (indicated by the white region) formed atop the solder mask layer. Leak barriers 240 are provided as a physical barrier to the flow of leaked coolant liquid, as illustrated. As such, PCB 200 provides for the sinking of current to a ground plane of the PCB via leak grounding trace 230, and the directing of the leaked coolant liquid away from sensitive circuit 220 by leak barriers 240.

A single leak barrier similar to leak barriers 240 may be utilized as needed or desired. However having two (2) or more leak barriers that are placed in proximity to each other, as with leak barriers 240, will result in a channel that will tend to wick leaked coolant liquid away from sensitive circuit 220, as illustrated. Where leak barriers 240 are formed around one of power circuits 210 or sensitive circuit 220, that one or more gaps may be fabricated in an outer one of the leak barriers to permit the leaked coolant liquid to escape the channel formed by the leak barriers. Thus in a particular embodiment, leak barriers 240 are configured to redirect leaked coolant liquid toward other structures configured to remove the leaked coolant liquid from the surface of PCB 100, such as drain structures, pumps, or the like.

Figure 3:
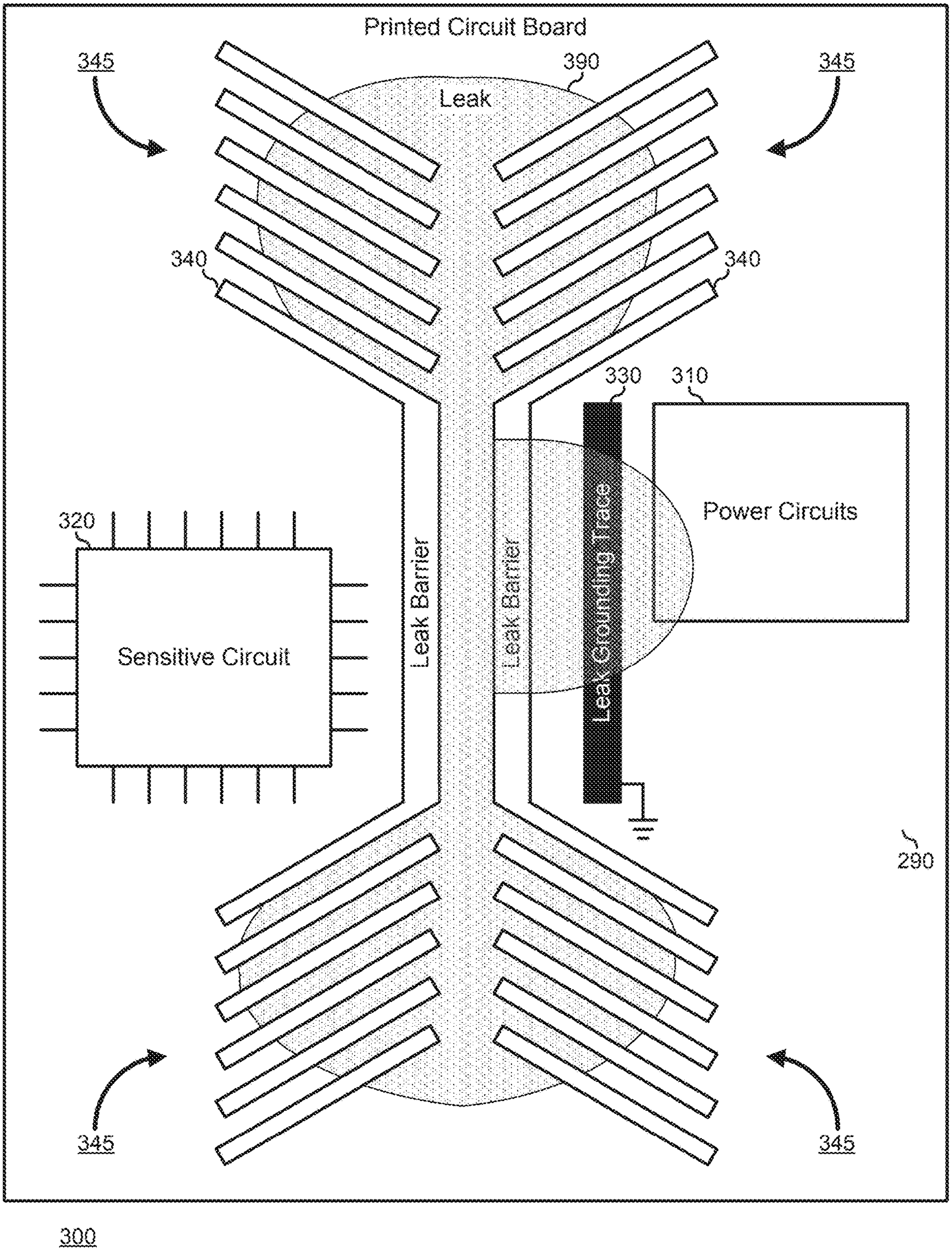
FIG. 3 illustrates a PCB according to another embodiment of the present disclosure.

FIG. 3 illustrates a PCB 300 similar to PCB 200. As such, PCB 300 includes power circuits 310 similar to power circuits 210, sensitive circuits 320 similar to sensitive circuits 220, a leak grounding trace 330 similar to leak grounding trace 230, and leak barriers 340 similar to leak barriers 240. PCB 300 is illustrated as experiencing a coolant liquid leak 390. PCB 300 further includes capillary pump structures 345 associated with leak barriers 340. In particular, capillary pump structures 345 represent features fabricated on the surface of PCB 300 that are configured to present a raised profile over the other features provided on the surface of the PCB and further to wick larger quantities of leaked coolant liquid away from sensitive circuit 320. For example, capillary pump structures 345 may include a circuit trace layer on the surface of PCB 300, a solder mask layer formed atop the circuit trace, and a silk screen printed layer formed atop the solder mask layer. Capillary pump structures 345 are provided as physical barriers to the flow of leaked coolant liquid, and to pump, via capillary action, the leaked coolant liquid to predetermined areas on the surface of PCB 300, as illustrated. As such, PCB 300 provides for the sinking of current to a ground plane of the PCB via leak grounding trace 330, and the directing larger volumes of the leaked coolant liquid away from sensitive circuit 320 by leak barriers 340 and capillary pump structures 345.

Capillary pump structures 345 are illustrated as parallel structures angled away from leak barriers 340, but this is not necessarily so and capillary pump structures may be provided in any known configuration, as needed or desired. For example a capillary pump structure may be provided as post-type structure, a tree-type structure, a symmetric, asymmetric, balled, tree, or other line-type structure, a hexagonal structure, or the like. In a particular embodiment, leak barriers 340 and capillary pump structures 345 are configured to redirect leaked coolant liquid toward other structures configured to remove the leaked coolant liquid from the surface of PCB 100, such as drain structures, pumps, or the like.

Figure 4:
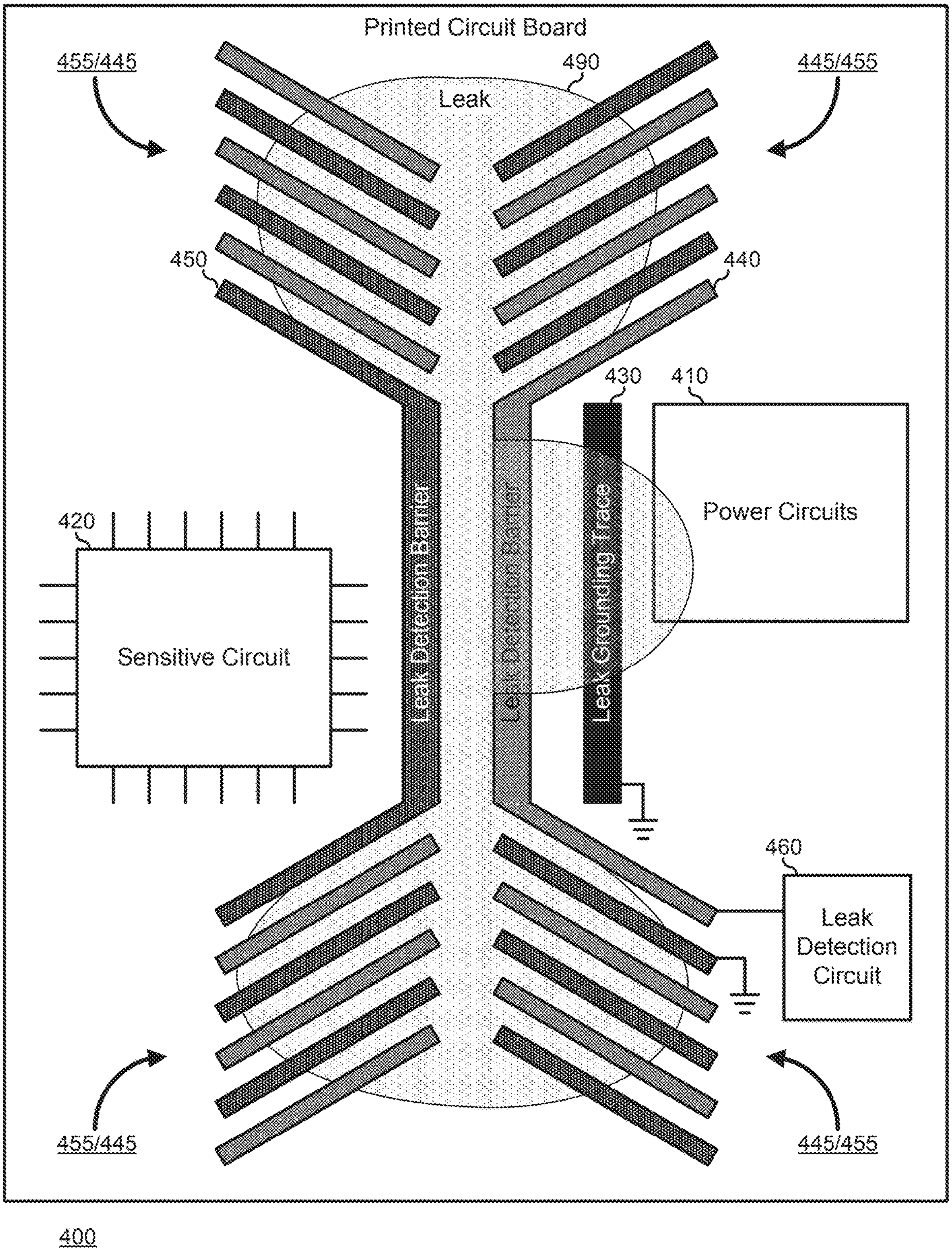
FIG. 4 illustrates a PCB according to another embodiment of the present disclosure.

FIG. 4 illustrates a PCB 400 similar to PCB 300. As such, PCB 400 includes power circuits 410 similar to power circuits 310, sensitive circuits 420 similar to sensitive circuits 320, a leak grounding trace 430 similar to leak grounding traces 330, leak barriers 440 and 450 similar to leak barriers 340, and capillary pump structures 445 and 455 similar to capillary pump structures 345. However, here, leak detection barrier 440 and capillary pump structures 445 are electrically connected together, as illustrated by the lighter pattern, and leak detection barrier 450 and capillary pump structures 455 are electrically connected together, as illustrated by the darker pattern. For example, leak detection barrier 440 is shown as being directly connected to a first lane on the top and bottom of capillary pump structure 445, such as by being formed as a common circuit trace on the surface of PCB 400. Further, the additional lanes of capillary pump structure 445 may be connected together through through-hole vias to a common connection layer within PCB 400. Leak detection barrier 450 and capillary pump structure 455 may be fabricated similarly.

Leak detection barrier 440/capillary pump structure 445 are connected to a leak detection circuit 460, and leak detection barrier 450/capillary pump structure 455 are connected to a circuit ground plane of PCB 400. Leak detection circuit 460 represents a circuit is configured to detect a coolant liquid leak. In particular, leak detection circuit 460 may be configured to drive a signal onto leak detection barrier 440/capillary pump structure 445, and to sense the signal to determine the presence of a coolant liquid leak. In a particular embodiment, the signal represents a DC voltage. Here, the presence of coolant liquid leak 490 anywhere between leak detection barrier 440/capillary pump structure 445 and leak detection barrier 450/capillary pump structure 455 operates to provide a high-impedance path (due to the low conductivity of the coolant liquid) between the DC voltage and the ground provided by leak detection barrier 450/capillary pump structure 455, and the resultant voltage drop is sensed by leak detection circuit 460 and leak 490 is thereby detected. In another embodiment, the signal represents a more complex signal, and the detection of leak 490 may be determined based on an analysis, such as a Discrete Fourier Transform (DFT), of the resultant return signal. Here, the magnitude of leak 490 may be determined based on the result of the DFT analysis. The details of leak detection are known in the art and will not be further described herein, except as may be needed to illustrate the current embodiments.

Figure 5:
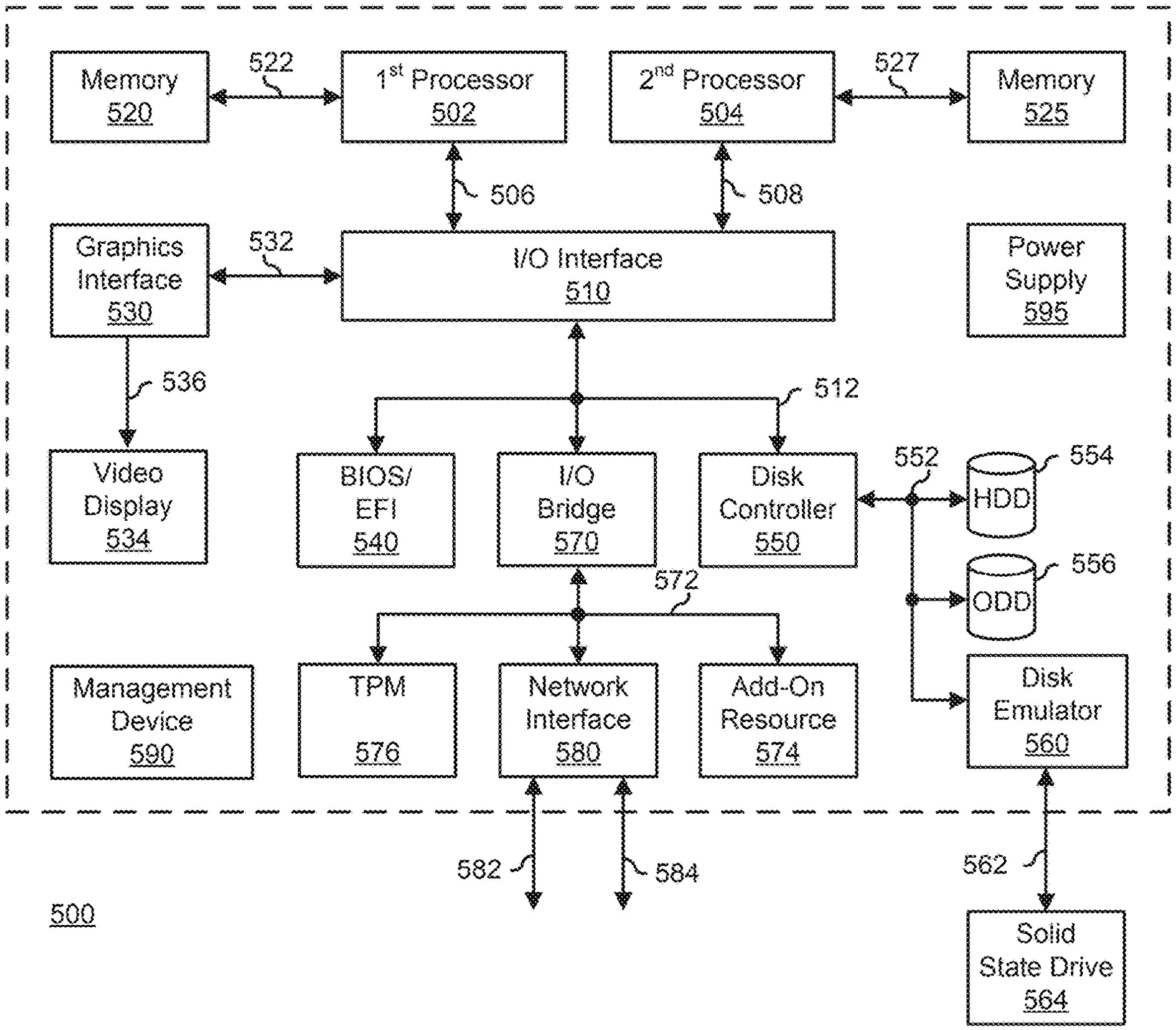
FIG. 5 is a block diagram illustrating a generalized information handling system according to another embodiment of the present disclosure.

FIG. 5 illustrates a generalized embodiment of an information handling system 500 similar to information handling system 500. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, a management device 590, and a power supply 595. Processors 502 and 504, I/O interface 510, memory 520, graphics interface 530, BIOS/UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532, and provides a video display output 536 to a video display 534. In a particular embodiment, information handling system 500 includes separate memories that are dedicated to each of processors 502 and 504 via separate memory interfaces. An example of memories 520 and 530 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512, or can be a different type of interface. As such, I/O bridge 570 extends the capacity of I/O channel 512 where peripheral interface 572 and the I/O channel are of the same type, and the I/O bridge translates information from a format suitable to the I/O channel to a format suitable to the peripheral channel 572 where they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 where the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed:

1. A printed circuit board (PCB), comprising:
- a first circuit having a first contact on a surface of the PCB, the first contact being at a first voltage;
- a second circuit having a second contact on the surface of the PCB, the second contact being at a second voltage, wherein the first voltage is higher than the second voltage; and
- a circuit trace on the surface of the PCB and coupled to a ground plane of the PCB, the circuit trace being disposed between the first contact and the second contact, the circuit trace configured to provide a ground path to ground the first contact in the presence of coolant liquid between the first contact and the circuit trace.

2. The PCB of claim 1, wherein the circuit trace is disposed surrounding the first circuit.

3. The PCB of claim 2, wherein the circuit trace includes a gap configured to allow the coolant liquid to drain away from the first circuit.

4. The PCB of claim 1, wherein the circuit trace is disposed surrounding the second circuit.

5. The PCB of claim 4, wherein the circuit trace includes a gap configured to allow the coolant liquid to drain away from the first circuit.

6. The PCB of claim 1, wherein the circuit trace is further configured to provide the ground path to ground the second contact in the presence of the coolant liquid between the second contact and the circuit trace.

7. The PCB of claim 1, further comprising a passivation layer disposed on the surface of the PCB.

8. The PCB of claim 7, wherein the passivation layer is not disposed on the circuit trace.

9. The PCB of claim 1, wherein the circuit trace is closer to the first contact than to the second contact.

10. The PCB of claim 1, wherein the first circuit is a power circuit of the PCB, and the second circuit is a logic circuit of the PCB.

11. A method, comprising:
providing, on a printed circuit board (PCB), a first circuit having a first contact on a surface of the PCB, the first contact being at a first voltage;
providing, on the PCB, a second circuit having a second contact on the surface of the PCB, the second contact being at a second voltage lower than the first voltage; and
providing, on a surface of the PCB, a circuit trace coupled to a ground plane of the PCB, the circuit trace being disposed between the first contact and the second contact, the circuit trace configured to provide a ground path to ground the first contact in the presence of coolant liquid between the first contact and the circuit trace.

12. The method of claim 11, wherein the circuit trace is disposed surrounding the first circuit.

13. The method of claim 12 further comprising including, in the circuit trace, a gap configured to allow the coolant liquid to drain away from the first circuit.

14. The method of claim 11, wherein the circuit trace is disposed surrounding the second circuit.

15. The method of claim 14 further comprising including, in the circuit trace, a gap configured to allow the coolant liquid to drain away from the second circuit.

16. The method of claim 11, wherein the circuit trace is further configured to provide the ground path to ground the second contact in the presence of the coolant liquid between the second contact and the circuit trace.

17. The method of claim 11, further comprising providing a passivation layer disposed on the surface of the PCB.

18. The method of claim 17, wherein the passivation layer is not disposed on the circuit trace.

19. The method of claim 11, wherein the circuit trace is closer to the first contact than to the second contact.

20. A printed circuit board (PCB), comprising:
a first circuit having a first contact on a surface of the PCB, the first contact being at a first voltage;
a second circuit having a second contact on the surface of the PCB, the second contact being at a second voltage, the first voltage being higher than the second voltage;
a circuit trace on the surface of the PCB and coupled to a ground plane of the PCB, the circuit trace being disposed between the first contact and the second contact, the circuit trace configured to provide a ground path to ground the first contact in the presence of coolant liquid between the first contact and the circuit trace, and to provide the ground path to ground the second contact in the presence of the coolant liquid between the second contact and the circuit trace; and
a passivation layer disposed on the surface of the PCB.

* * * * *